US008674220B2

(12) United States Patent  
Loibl et al.

(10) Patent No.: US 8,674,220 B2
(45) Date of Patent: Mar. 18, 2014

(54) ELECTRONICS HOUSING WITH STANDARD INTERFACE

(75) Inventors: Josef Loibl, Bad Abbach (DE); Karl Smirra, Wasserburg (DE)

(73) Assignee: Continental Automotive GmbH, Hannover (DE)

( * ) Notice: Subject to any disclaimer, the term of this patent is extended or adjusted under 35 U.S.C. 154(b) by 804 days.

(21) Appl. No.: 12/513,615

(22) PCT Filed: Oct. 22, 2007

(86) PCT No.: PCT/EP2007/061249
§ 371 (c)(1),
(2), (4) Date: May 5, 2009

(87) PCT Pub. No.: WO2008/055766
PCT Pub. Date: May 15, 2008

(65) Prior Publication Data
US 2010/0067202 A1    Mar. 18, 2010

(30) Foreign Application Priority Data

Nov. 7, 2006  (DE) .......................... 10 2006 052 459

(51) Int. Cl.
*H05K 5/00* (2006.01)

(52) U.S. Cl.
USPC .............. 174/50.52; 174/50.5; 174/50.51; 174/50.53; 361/748; 361/749; 361/752; 361/760; 361/777; 361/803; 361/807; 361/810; 439/876

(58) Field of Classification Search
USPC ......... 361/760, 777, 803, 807, 810, 748, 749, 361/752; 439/876; 174/50.5, 50.51, 50.52, 174/50.53
See application file for complete search history.

(56) References Cited

U.S. PATENT DOCUMENTS 4,490,614 A     12/1984  Peerenboom et al.
5,045,641 A  *  9/1991  Urushibata et al. ......... 174/74 R (Continued)

FOREIGN PATENT DOCUMENTS

CN      1610488 A     4/2005
CN      1845838 A    10/2006

(Continued)

OTHER PUBLICATIONS

Chinese Office Action dated Mar. 22, 2011. English translation.

*Primary Examiner* — Jinhee Lee
*Assistant Examiner* — James Wu
(74) *Attorney, Agent, or Firm* — Laurence A. Greenberg; Werner H. Stemer; Ralph E. Locher

(57) ABSTRACT

A housing for an electronic control device includes at least two housing parts, at least one housing base, a housing lid and an electronic connection between components disposed inside the housing and components disposed outside the housing. The connection is fixed to the base of the housing. The electronic connection is either constructed as a single-component flexible printed circuit board or as at least one partial flexible printed circuit board including at least one uniform open area of a copper conductor track outside an area covered by the housing lid. The width of the uniform region is oriented to a predefined contacting type of peripheral components and is longer than necessary for the contacting type. The invention therefore provides for a variable adaptation of generic electronics housings, thereby not necessarily requiring a novel structure of the housing with corresponding expensive individual packaging.

13 Claims, 5 Drawing Sheets

(56) References Cited

U.S. PATENT DOCUMENTS

| | | | | |
|---|---|---|---|---|
| 5,280,413 | A | * | 1/1994 | Pai .................................. 361/792 |
| 5,418,685 | A | * | 5/1995 | Hussmann et al. ............ 361/719 |
| 5,639,989 | A | * | 6/1997 | Higgins, III ................... 174/386 |
| 5,751,554 | A | * | 5/1998 | Williams et al. ............... 361/760 |
| 6,165,814 | A | * | 12/2000 | Wark et al. ..................... 438/108 |
| 6,300,565 | B1 | * | 10/2001 | Loibl et al. ..................... 174/520 |
| 6,533,620 | B2 | * | 3/2003 | Franzen et al. ................ 439/876 |
| 6,934,160 | B2 | * | 8/2005 | Heismann et al. ............. 361/749 |
| 7,952,885 | B2 | | 5/2011 | Loibl et al. |
| 2002/0001984 | A1 | | 1/2002 | Franzen et al. |
| 2003/0122228 | A1 | * | 7/2003 | Nagase et al. .................. 257/678 |
| 2004/0221448 | A1 | | 11/2004 | Naito et al. |
| 2006/0023431 | A1 | * | 2/2006 | Wetzel ............................ 361/739 |
| 2006/0209520 | A1 | * | 9/2006 | Masai et al. .................... 361/777 |
| 2007/0297152 | A1 | | 12/2007 | Janisch et al. |
| 2008/0019106 | A1 | | 1/2008 | Wetzel et al. |
| 2008/0087463 | A1 | | 4/2008 | Ingenbleek et al. |
| 2009/0002959 | A1 | | 1/2009 | Loibl et al. |
| 2009/0053943 | A1 | | 2/2009 | Fink et al. |

FOREIGN PATENT DOCUMENTS

| | | |
|---|---|---|
| DE | 3315655 A1 | 11/1983 |
| DE | 19907949 A1 | 9/2000 |
| DE | 102004033559 A1 | 2/2006 |
| DE | 102004036683 A1 | 3/2006 |
| DE | 102004050687 A1 | 4/2006 |
| DE | 102005002813 A1 | 8/2006 |
| DE | 102005003448 A1 | 8/2006 |
| DE | 102005015717 A1 | 10/2006 |
| JP | 2002538599 A | 11/2002 |
| JP | 2008507836 A | 3/2008 |
| WO | 9844593 A1 | 10/1998 |
| WO | 0049841 A1 | 8/2000 |
| WO | 2006010652 A1 | 2/2006 |

* cited by examiner

US 8,674,220 B2

ELECTRONICS HOUSING WITH STANDARD INTERFACE

BACKGROUND OF THE INVENTION

1. Field of the Invention

The invention relates to an electronics housing for an electronic control device according to the preamble of claim 1 as well as to a method for manufacturing a housing of said type, in particular for transmission controls or engine management systems in the automobile industry.

Electronic control devices generally have a plurality of electronic components which are connected to other components disposed outside the control device. Normally they are installed in special housings or enclosures in order to protect them against environmental influences or mechanical stresses. In addition the housings fulfill an important shielding function. In order to allow a reliable connection to components located outside the housing, an electrical connection from the housing interior to the housing exterior is necessary.

2. Prior Art

DE 10 2004 033 559 A1 describes a connection of said type which is arranged between the housing interior and the housing exterior and is integrally extruded or molded with the housing wall. In this arrangement the housing wall has a cavity into which additional sealing material is introduced. Said sealing material encloses the electrical connection and seals the feedthrough of the electrical connection through the housing wall. In addition the sealing material enables the housing wall to be sealed off with the lid and/or the base.

The disadvantage of this arrangement is that it is necessary to manufacture the housing components specifically for each control device because of the molded-in or press-fitted electrical connections. Moreover, signs of fatigue in the sealing material can become apparent over the course of the lifetime of a control device of said kind, in particular in an extremely aggressive environment such as in the case of transmission control devices which are surrounded by chemically highly corrosive transmission fluid and at the same time are required to withstand high temperatures.

DE 33 15 655 A1 describes an electrical connection using flexible printed circuit boards. The flexible printed circuit boards are inserted at a connecting point between the housing and the lid and are also sealed off by way of molded gaskets with the housing and the lid. Said flexible conductor tracks can be brought from the connecting point directly to the electrical component in the housing interior. As a result the arrangement of the components is relatively flexible.

Furthermore, DE 10 2004 036 683 A1 discloses an arrangement for electrically connecting control electronics to peripheral components such as, for example, sensors, valves or connectors by means of contacting to partial flexible printed circuit boards.

As an example of a generic form of contacting, reference is made to DE 10 2004 050 687 A1. Described there is a possibility for direct contacting of a cable or cable harness which acts on a flexible printed circuit board.

In these instances too, however, there exists in each case the disadvantage that for each control device it is necessary to manufacture an individually tailored layout geared to the components involved for the housing and the geometry of the flexible printed circuit boards. If the contacting specifications for the peripheral components are changed or even the size and geometry of the central electronic substrate modified, a new layout for the housing and the flexible printed circuit boards must perforce also be found and produced. This constraint exists irrespective of whether the flexible printed circuit boards are embodied as a single piece or as partial boards.

BRIEF SUMMARY OF THE INVENTION

It is therefore the object of the invention to provide a variable concept for a plurality of housings for an electronic control device having at least one electronic connection, embodied as a flexible printed circuit board, between the housing interior and the housing exterior, which electronic connection allows a uniform, simple and flexible connection to components located outside the housing. Furthermore the sealing of the feedthrough of the electrical connection is preferably to be hermetically tight and withstand high mechanical and chemical stresses over the entire lifetime of the control device, even at high temperatures. This is achieved according to the invention by means of a device as claimed in claim 1 and by means of a method for manufacturing a device of said kind as claimed in claim 8.

It is proposed according to the invention to provide at least one freely accessible, open area of the copper conductor tracks of the flexible printed circuit board outside of the area covered by the housing lid on the top side of the electronic component, the size of said open area being geared to the width specification of the specific contact type. Moreover, the open area of the conductor track has a length that is more than adequate to be able to accommodate the contacting requirements of the different peripheries in a variable manner. In this way it is possible for the first time to provide a unified concept for a plurality of generic electronics housings which can accommodate changes to specifications in the geometry of the peripheral components or the electronic substrates considerably more cost-effectively, principally by means of a standardized fabrication of the flexible printed circuit boards. In particular the entire housing can also be adjusted in size in a cost-effective and simple manner for the first time. A hitherto necessary complete redesign of the electronics housing is therefore rendered superfluous.

Preferably a plurality of open areas running in parallel and having a width and length corresponding to the copper conductor tracks are provided for contacting a component located outside the housing.

In a preferred embodiment, the open, freely accessible area of the copper conductor track has a width of approx. 3 mm. This dimensioning is inventively aligned to the contacting type provided.

A flexible printed circuit board having conductor tracks that is known per se can be used as the electrical connection. Equally, however, one or more partial flexible printed circuit boards in accordance with the arrangement described in DE 10 2004 036 683 A1 can be used. An advantageous aspect of this exemplary embodiment is to prepare individual partial flexible printed circuit boards in such a way that the contacting means to the open areas of the conductor tracks for individual component types can already be taken into account and standardized at this early stage in the fabrication of an individual component. Furthermore this embodiment variant fulfills the further advantageous parameters of keeping the overall surface area of the flexible printed circuit boards to a minimum, in particular for cost reasons. This embodiment of the invention also permits an optimal separation of the signal and current paths.

The flexible printed circuit board can consist, for example, of a bottom polyimide base film, metallic conductor tracks arranged thereon embedded in an adhesive layer, and a top polyimide cover film. Preferably multilayer flexible printed circuit boards, which by definition have a plurality of copper conductor track layers separated by insulation layers, can also be used as the electrical connection.

Alternatively, the top polyimide cover film can also be completely or partially omitted, provided the area not covered by the top polyimide cover film is protected from external influences by other component parts of the inventive housing, such as, for example, by the housing lid and/or by contacting covers. Further, preferably more economical, materials can also be used both for the base film and for the adhesive layer. Thus, for example, materials of a kind which can be applied using a spraying, varnishing or screen-printing method can be provided in order to reduce costs. In addition it is possible to vary the layer thickness of the individual layers.

In order to allow the subsequent fitting of the housing lid a depression, for example, can be provided around the perimeter for the purpose of receiving a sealing gasket or a sealing material. Alternatively or in addition, the housing lid can also be joined to the baseplate and/or the flexible printed circuit board by means of riveting, adhesive bonding or soldering. What is important here above all is to ensure a good seal in case the electronic components are subsequently to be used in an aggressive environment such as, for example, in a transmission or in an engine.

If the housing lid is fixed by means of soldering, a metallic track running uninterruptedly around the perimeter is first arranged on the surface of the baseplate and/or flexible conductor track. Preferably said metallic area maps the top contact surface of the housing lid.

The housing base preferably consists of a metallic material; particularly preferably it is made of aluminum. In a preferred embodiment of the invention the flexible printed circuit board is laminated onto the metallic housing base. This ensures a reliable, hermetically sealed and low-cost fixing. The housing lid can consist of any material that ensures adequate protection of the electronics against the given environmental conditions. In addition to housing lids made of plastic, lids made of metallic materials can also be used. If the intention is to fix the housing lid in place by means of soldering, a housing lid made of metal should preferably be provided. At the same time this provides the necessary EMC shielding values and an increased rigidity. Alternatively a metalized plastic molded body can also be used. In an advantageous embodiment, however, the housing lid is manufactured from a metallic material such as, for example, sheet steel or die casting. This results in increased long-term stability, good diffusion resistance toward aggressive chemicals, and improved shielding values over the entire lifespan of the control device.

In order to manufacture an inventive housing for a control device, a single-piece flexible printed circuit board or one or more partial flexible printed circuit boards is or are placed onto the housing base, said printed circuit board(s) having at least one inventive open area of the copper conductor track with uniform width and length. The contacting to the electronic components in the interior of the housing is established in each case and then the housing lid is placed onto the corresponding area of the electronic connection and fixed. The open areas of the flexible printed circuit board with the subsequently established contacting are preferably protected against external influences by means of contacting covers. External influences of said kind can include, for example, metallic swarf from manufacturing residues of the transmission or engine housing which could lead to short-circuits of the contacting or of the open areas of the copper conductor tracks.

According to the present invention, a flexible printed circuit board or a plurality of partial flexible printed circuit boards is or are laminated onto a housing base, preferably one made of aluminum. Particularly preferably the flexible printed circuit board is fixed on the housing base by means of acrylic adhesive.

Connections between electronic components disposed outside the housing and the electronic connection of the present invention can be established in any known manner. Thus, the connections can be produced as detachable, for example as plug-in connectors, or non-detachable by means of, for example, soldering, welding, or crimping. Particularly preferably, the electronic connection is directly connected both to the electronic substrate in the interior of the housing and to the signal transmitters and receivers (in particular sensors, valves, etc.) disposed outside of the housing, and it is particularly preferred if the means used is thick-wire bonding. This enables the number of connections to be significantly reduced and in this way part failures due to defective interfaces such as e.g. connectors can be avoided. Proneness to faults is reduced considerably thereby.

BRIEF DESCRIPTION OF THE SEVERAL VIEWS OF THE DRAWING

The invention is explained below in an exemplary manner with reference to two embodiment variants in conjunction with the drawings, in which.

DESCRIPTION OF THE INVENTION

Figure 1:
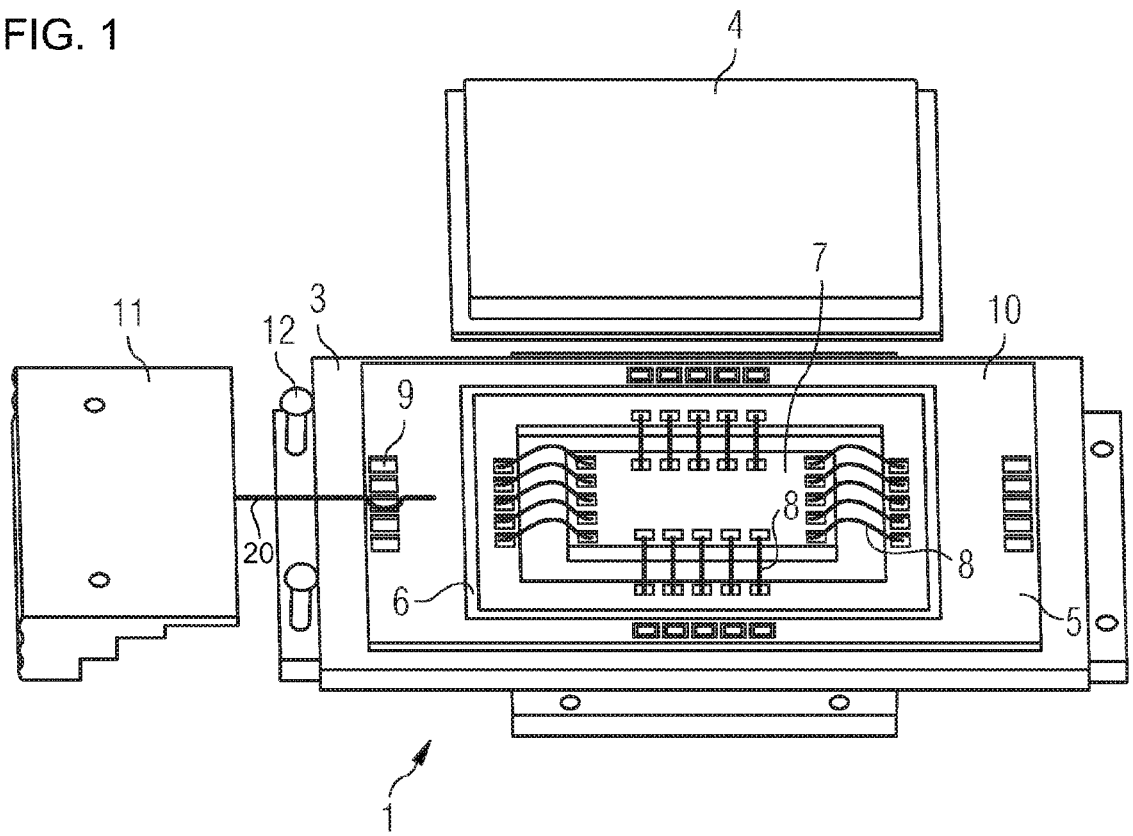
FIG. 1 shows a part-exploded perspective plan view of an electronic device.

FIG. 1 shows an electronic device 1 which is provided for installation in a motor vehicle transmission. The housing 2 of the electronic device is formed from a metallic baseplate 3 and a housing lid 4 made of sheet steel or aluminum. A flexible printed circuit board 5 is fixed on the metallic baseplate 3. Around its perimeter the printed circuit board 5 has a sealing zone 6 which corresponds in shape to the contact surface of the housing lid 4. Inside the housing is an electronic substrate 7 which can have different electronic components for example. The substrate 7 with its different electronic components in the interior of the housing is connected to the flexible printed circuit board 5 via direct contacts 8. Furthermore the flexible printed circuit board 5 shown is cut out in the interior of the housing and the electronic substrate 7 is disposed in the cutout thus produced. In its edge zones the flexible printed circuit board 5 has contacting points 9 for directly contacting to conductors 20 of peripheral components which, in terms of their size and arrangement, are specially adapted to the components located outside the housing that are to be connected. Said contacting points 9 are not covered by the protecting top cover layer 10 of the printed circuit board 5, but by way of separate contacting covers 11 as swarf protection and protection against other environmental factors.

Figure 2:
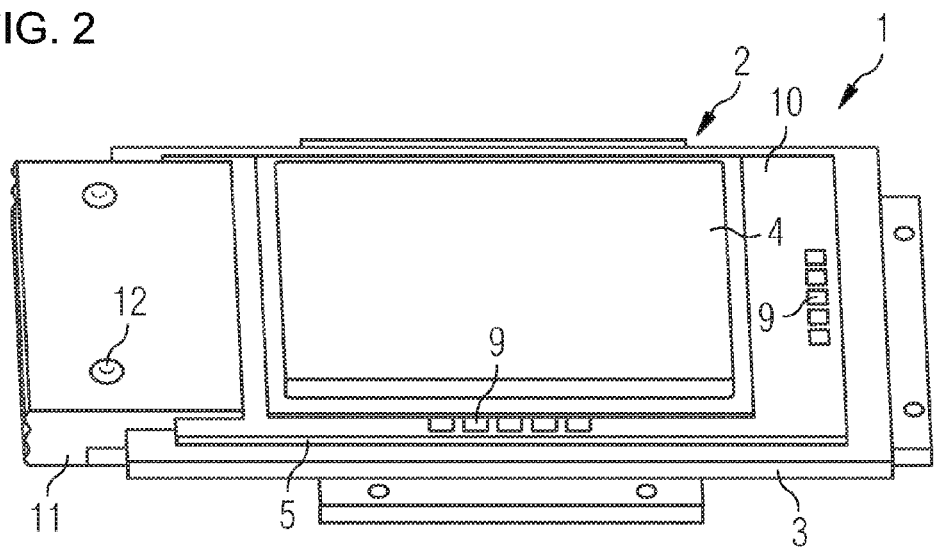
FIG. 2 shows a perspective plan view onto the electronic device in FIG. 1 with the housing closed.

FIG. 2 shows an electronic device 1 from FIG. 1 with closed, hermetically sealed housing 2. The baseplate 3 carries the printed circuit board 5, with the housing lid 4 being disposed around the perimeter fixed directly on the printed circuit board 5. The printed circuit board 5 has a greater surface area than the housing lid 4 and protrudes under the contact surface of the lid 4. The contacting points 9 are arranged outside the housing lid 4 in the edge zone of the printed circuit board. In the view shown, the open contacting points 9 are covered by a contacting cover 11 on one side of the printed circuit board 5. The remaining conductor track areas are protected by the top cover layer 10 of the printed circuit board 5. The contacting covers 11 are fixed to the baseplate 3 of the electronic device 1 by fastening means 12.

Figure 3:
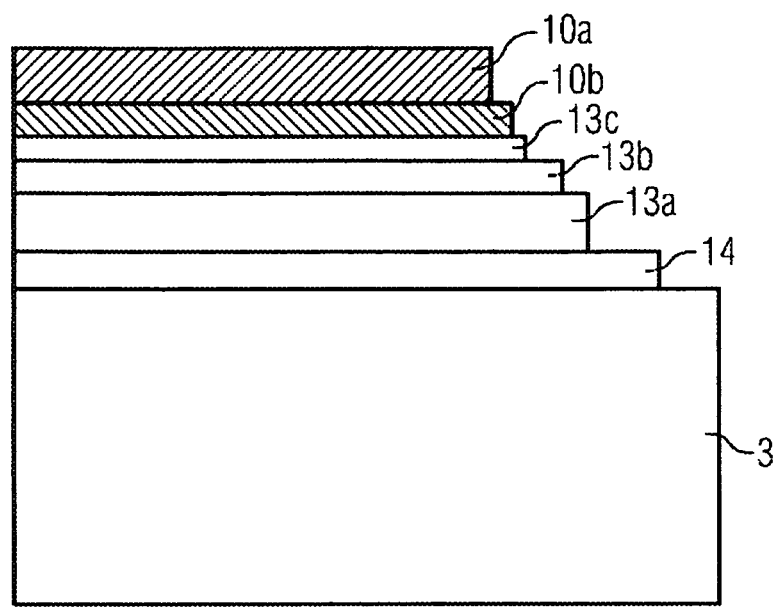
FIG. 3 shows a sectional view of a partial section of a flexible printed circuit board.

FIG. 3 shows a sectional view of the structure of the different layers of a flexible printed circuit board 5 for connection setup in mechatronic applications. This consists of a base layer 13 as a composite made of polyimide film 13*a*, acrylic adhesive film 13*b* and Cu film 13*c*. The copper layer 13*c* receives a conductive track pattern by means of an etching process. To provide the necessary protection against contamination, damage and conductor track short-circuits (swarf protection), a cover layer 10 made of polyimide film 10*a* is laminated onto the patterned Cu layer 13*c* using acrylic adhesive 10*b*. This entire composite consisting of base layer 13 and cover layer 10 is then laminated onto a baseplate 3 by means of a further adhesive layer 14.

Figure 4:
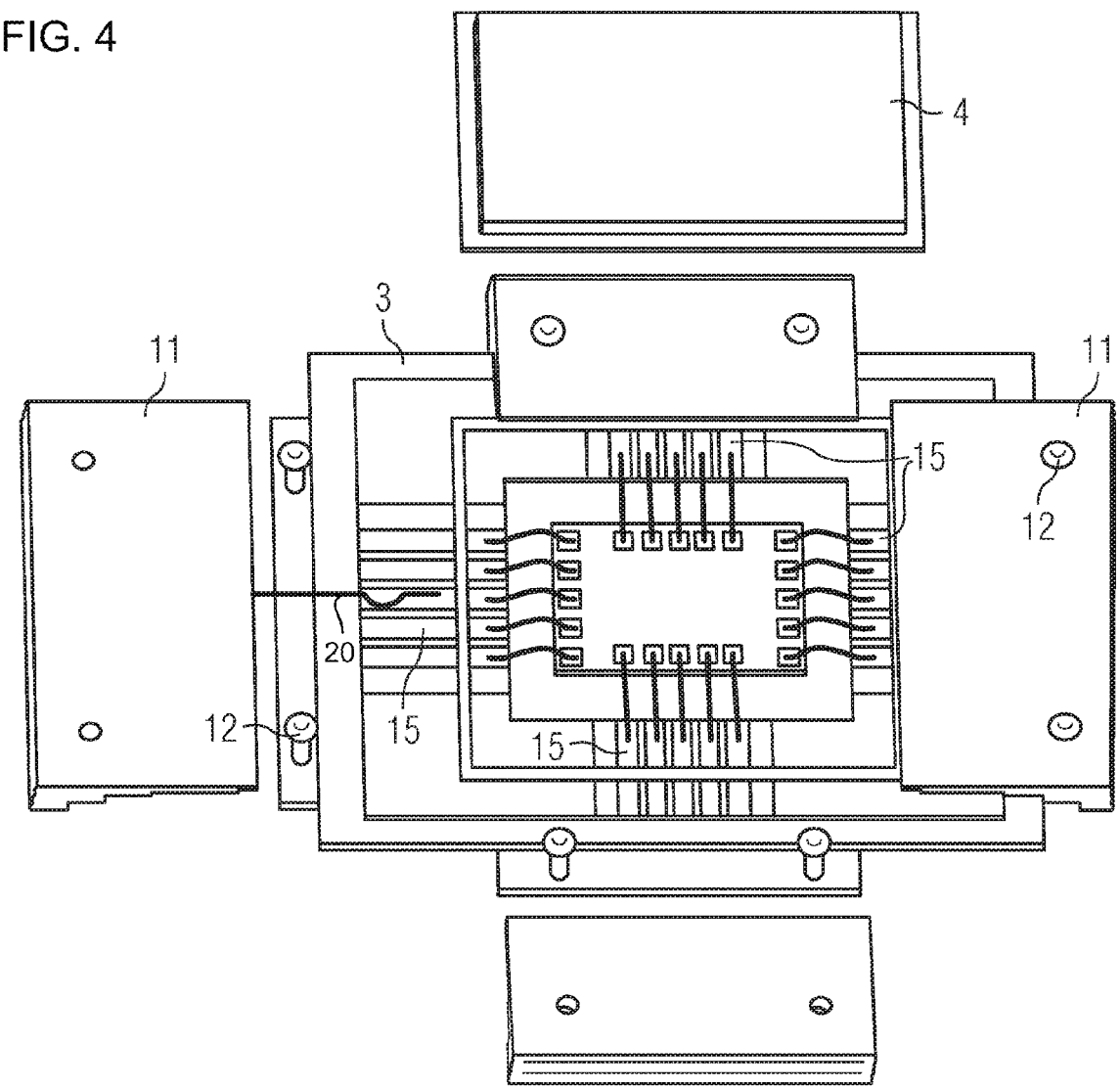
FIG. 4 shows a plan view in a part-exploded representation onto an inventive electronic device containing a single-piece flexible printed circuit board without cover layer.

FIG. 4 shows a preferred embodiment of the electronic device 1 according to the invention. The housing 2 of the electronic device 1 is formed from a metallic baseplate 3 and a housing lid 4 made of sheet steel or aluminum. A single-piece flexible printed circuit board 5 is fixed on the metallic baseplate 3. Said printed circuit board 5 is produced without cover layer 10 and consequently all the conductor track areas 15 are left exposed. Around its perimeter the flexible printed circuit board 5 has a sealing zone 6 which corresponds in its shape essentially to the contact surface of the housing lid 4. Inside the housing is an electronic substrate 7 which comprises, for example, a plurality of different electronic components. The flexible printed circuit board 5 shown is also cut out in the interior of the housing and the electronic substrate 7 is arranged in the cutout thus produced. The connections from the electronic substrate 7 to the flexible printed circuit board 5 are established by means of thick-wire bonds 8. The electronic substrate 7 preferably contains a plurality of individual components and is particularly preferably a ceramic substrate. The inventive open conductor track areas having a width geared to the contacting type for the respective peripheral components (not shown) and a length greater than is necessary for the contacting are protected inside the sealing zone 6 of the housing lid 4 against contamination and environmental influences and outside by way of the separate contacting covers 11. Two of the contacting covers 11 are shown fixed in place and partially overlapping the sealing zone 6. The contacting covers 11 can alternatively terminate partially overlapping or else flush with the housing lid 4, thereby ensuring swarf protection and protection against further contamination of the exposed conductor track areas 15.

Figure 5:
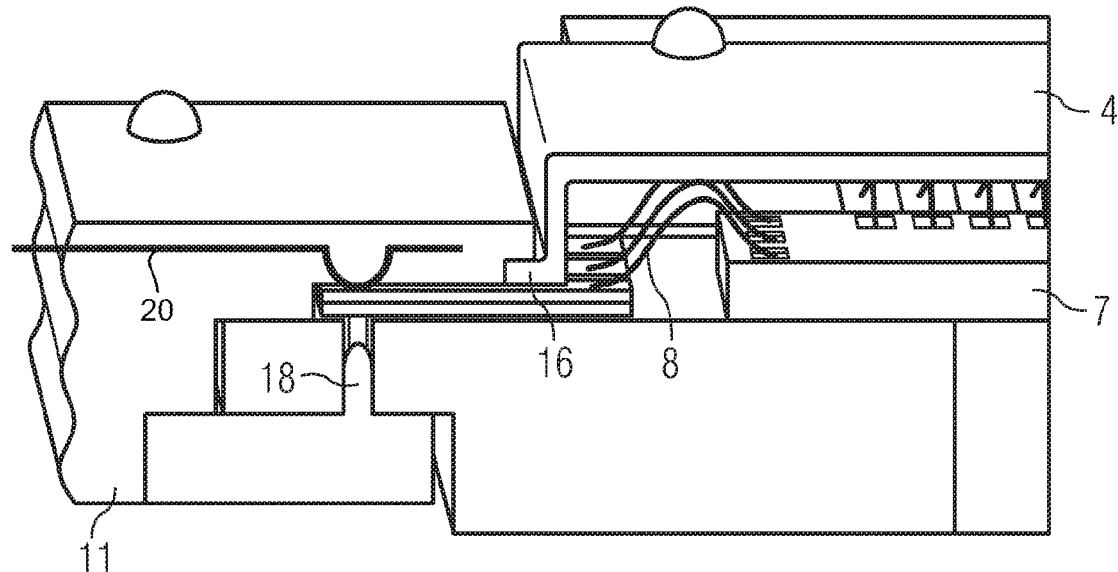
FIG. 5 shows a sectional representation of a partial section of a side of the electronic device from FIG. 4 with a closed contacting cover.

FIG. 5 shows a sectional view of a side of the electronic device 1 from FIG. 4 with a closed housing 2 and a closed contacting cover 11. The contacting cover 11 and housing lid 4 are embodied and arranged in an overlapping manner in such a way that a labyrinth sealing path 16 is formed for the purpose of covering the inventively uniform, open conductor track areas 15 of the flexible printed circuit board 5. According to the present preferred embodiment of the invention, the housing base 3 has a recess 18 in the area of the contacting point for the components located outside, which recess is in this case sealed by means of a cover projecting into the recess 18.

Figure 6:
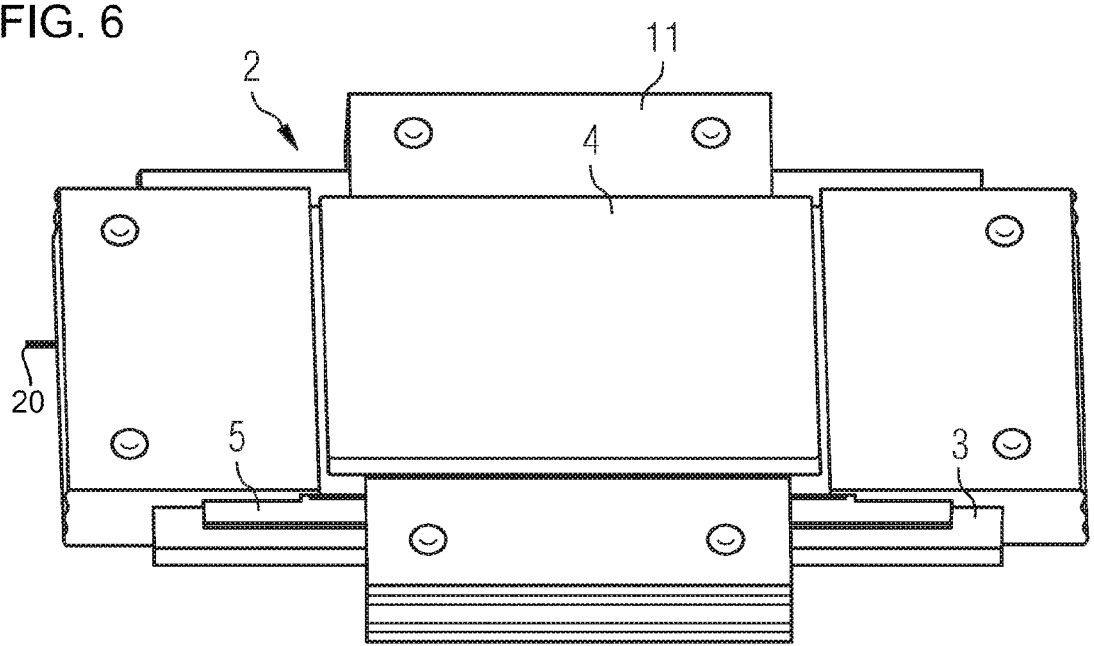
FIG. 6 shows an electronic device from FIG. 4 with closed housing and closed contacting covers.

FIG. 6 shows the electronic device 1 from FIG. 4 and FIG. 5 with closed, hermetically sealed housing 2 and fixed contacting covers 11. The inventive uniform, open conductor track areas 15 are completely covered thereby.

Figure 7:
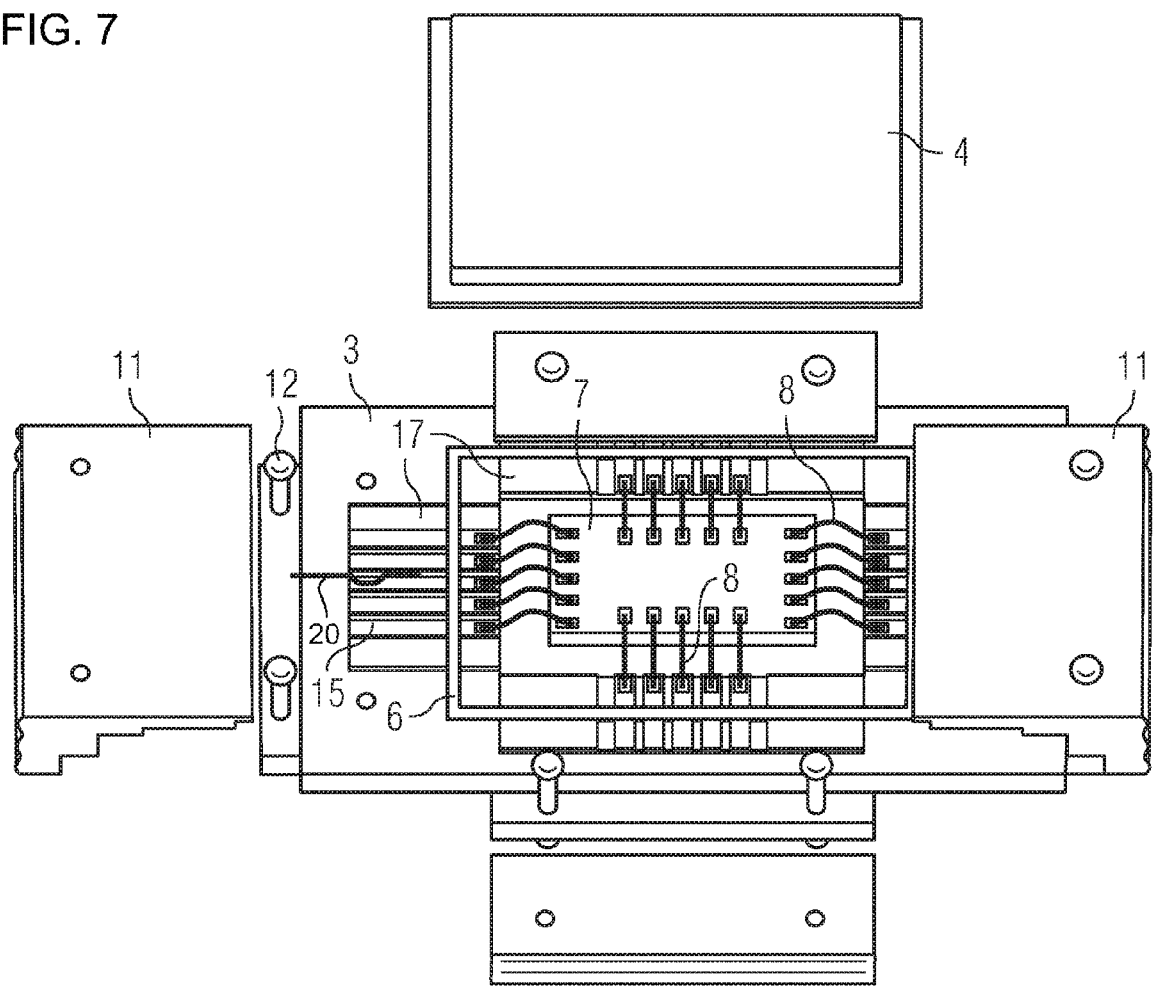
FIG. 7 shows a further preferred embodiment of the invention as a part-exploded view with partial flexible printed circuit board elements.

FIG. 7 shows a further preferred embodiment of the electronic device 1 according to the invention. The layout essentially corresponds to that shown in FIG. 4. In this embodiment variant, however, the flexible printed circuit board 5 is not implemented as a single piece. Instead, the contacting to the peripheral components is established by means of individual partial flexible printed circuit board film elements 17 having uniform, open conductor tracks 15 according to the invention.

This allows an optimal separation of signal and current paths and the use of expensive flexible printed circuit board surface areas can be reduced to a minimum. The partial flexible printed circuit boards can therefore be embodied such that an optimal printed panel utilization is possible and only a small amount of reject material is produced.

To sum up, a concept for providing a housing having a housing base and a housing lid is accordingly proposed together with an electronic connection between the interior of the housing and the components located outside the housing, wherein the flexible printed circuit board has standardized open areas of the copper printed circuit board for the purpose of contacting the peripheral components. The width of the standardized open areas is geared to the specified type of contacting and their length is greater than necessary for the purpose of direct contacting. In this way a variable adaptation of electronics housings to changing specifications in terms of the external components or the electronic substrate is possible for the first time. In particular the size of the entire housing can also be adjusted in an economical and simple manner for the first time. A costly and complicated redesign of the electronic device can thus be avoided. In addition standardized production of the flexible printed circuit boards is possible, which can result in a considerable cost advantage.

By means of a standardized structure it is furthermore possible to simplify quality control and thereby achieve a substantial reduction in the failure rate of such components due to defective interfaces. Electronic devices according to the invention can advantageously be used in a temperature range of −40° C. to +180° C.

The invention claimed is:

1. A housing for an electronic device, the housing comprising:
    at least two housing parts including at least one housing base and a housing lid, said housing base and said housing lid defining a housing interior for components;
    at least one electronic connection in the form of a flexible printed circuit board fixed on said at least one housing base and disposed between the components disposed in said housing interior and components located outside the housing, said electronic connection including at least one uniform, open, freely accessible area of a copper conductor track having a width determined by a contacting type for the components located outside the housing and a length greater than that required by the contacting type;
    at least one contacting cover located outside of said housing interior, said contacting cover protecting said freely accessible area of said copper conductor track from environmental influences occurring outside said housing interior; and a hermetic seal connecting said flexible printed circuit board and said housing lid together, wherein said flexible printed circuit board projects beyond said housing lid, and wherein said contacting cover and said housing lid form a sealing path on to of said freely accessible area of said copper conductor track.

2. The housing according to claim 1, wherein said at least one open area is a plurality of open areas running in parallel and having copper conductor tracks with a width corresponding to the contacting type.

3. The housing according to claim 1, wherein said electronic connection is a multilayer flexible printed circuit board.

4. The housing according to claim 1, wherein said housing base has a greater base area than said housing lid.

5. The housing according to claim 1, wherein said electronic connection is formed from at least two or more partial flexible printed circuit boards.

6. The housing according to claim 1, wherein the components located outside the housing are welded or soldered directly to said electronic connection.

7. A method for manufacturing a housing, the method comprising the following steps:

placing at least one electronic connection onto a housing base of a housing according to claim 1;

connecting the at least one electronic connection to an electronic substrate in an interior of the housing and to components located outside the housing; and fixing a housing lid onto a sealing zone.

8. The method according to claim 7, which further comprises connecting the electronic substrate to the at least one electronic connection by thick-wire bonding, and connecting the components located outside the housing to the at least one electronic connection by soldering, welding or crimping.

9. The method according to claim 7, which further comprises laminating at least one flexible printed circuit board as the electronic connection onto the housing base.

10. An electronic control device, comprising:
a housing having an electronic connection with at least one uniform, open, freely accessible area of a copper conductor track according to claim 1.

11. An electronic control device, comprising:
a housing for a transmission control of a motor vehicle, said housing having an electronic connection with at least one uniform, open, freely accessible area of a copper conductor track according to claim 1.

12. The housing according to claim 1, wherein said housing base and said housing lid are metal.

13. The housing according to claim 1, wherein said freely accessible area of said copper conductor track includes a portion extending past said housing lid such that said portion is not covered by said housing lid, and said portion is covered by said contacting cover.

* * * * *